(12) United States Patent
Angelopoulos et al.

(10) Patent No.: US 6,686,124 B1
(45) Date of Patent: Feb. 3, 2004

(54) MULTIFUNCTIONAL POLYMERIC MATERIALS AND USE THEREOF

(75) Inventors: Marie Angelopoulos, Cortlandt Manor, NY (US); Katherina E. Babich, Chappaqua, NY (US); David R. Medeiros, Yorktown, NY (US); Wayne M. Moreau, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/524,692

(22) Filed: Mar. 14, 2000

(51) Int. Cl.[7] .......................... G03C 1/76; C08F 212/06
(52) U.S. Cl. .................. 430/271.1; 430/270.1; 430/325; 526/271; 526/273; 526/279; 526/313; 526/332; 526/326; 526/347; 526/347.1
(58) Field of Search .................. 430/270.1, 271.1, 430/325; 526/313, 326, 347, 347.1, 279, 271, 332, 273, 319

(56) References Cited

U.S. PATENT DOCUMENTS

| | | | |
|---|---|---|---|
| 5,576,359 A | * 11/1996 | Urano et al. | 523/400 |
| 5,652,317 A | * 7/1997 | McCulloch et al. | 526/312 |
| 5,994,430 A | * 11/1999 | Ding et al. | 524/80 |
| 6,114,085 A | * 9/2000 | Padmanaban et al. | 430/270.1 |
| 6,124,372 A | * 9/2000 | Smith et al. | 522/35 |
| 6,368,768 B1 | * 4/2002 | Jung et al. | |
| 6,383,712 B1 | * 5/2002 | Jagannathan et al. | 430/270.1 |

FOREIGN PATENT DOCUMENTS

| EP | 698823 | * 2/1996 |
|---|---|---|
| JP | 8301990 | * 11/1996 |

OTHER PUBLICATIONS

CAPLUS abstract of JP 8301990, Nov. 1996.*

\* cited by examiner

*Primary Examiner*—Rosemary Ashton
(74) *Attorney, Agent, or Firm*—Connolly Bove Lodge & Hutz LLP; Daniel P. Morris

(57) ABSTRACT

A multifunctional polymer comprising a polymeric chain having chromophore groups and cross-linking sites is suitable as a resist material and especially as the underlayer for bilayer and top surface imaging strategies. The multifunctional polymer can function as an antireflective coating, planarizing layer or etch resistant hard mask.

31 Claims, 2 Drawing Sheets

MULTIFUNCTIONAL POLYMERIC MATERIALS AND USE THEREOF

FIELD OF THE INVENTION

The present invention relates to polymeric materials that are especially useful in the manufacture of integrated devices (IC), and in particular use in structures having a plurality of layers. More specifically, this invention is directed to carefully tuned underlayer materials for use in multilayered photoresist techniques. These materials contain multiple chemical functionalities along the same polymeric chain and have been developed to optimize their chemical and physical properties. The use of the structures allows for high resolution, high aspect ratio imaging with optical, electron beam, ion beam, x-ray, or EUV lithographic systems.

BACKGROUND OF THE INVENTION

Semiconductor device manufacturing places high demands on the lithographic processes that are the means by which the submicron features are generated. New geometries and ever-shrinking dimensions of microelectronic devices dictate increased resist performance in terms of ability to produce higher resolution features with higher aspects ratio and the ability to image over topography. Currently, state-of-the art single layer resists, used with KrF lasers emitting radiation at 248 nm, allow for the commercial production of features at the dimension of approximately 200–250 nm. At dimensions smaller than this, single layer resists simply cannot effectively provide the desired resolution. Many have seen a conversion to ArF, 193 nm laser systems, and corresponding 193 nm photoresist systems as the next logical step to extend the resolution capabilities of optical lithography. This involves intensive capital investment as entirely new, multimillion dollar tool sets are needed. An alternative to switching to 193 nm lithography that will extend the lifetime, and capital investment, of the 248 nm lithography systems is to introduce a multilayer imaging approach. In the longer term, as 193 nm, 157 nm, or other imaging becomes common place, this multilayer technology is amenable such that the resolution capabilities can be extended with that wavelength as well or to be used with e-beam, ion-beam, x-ray or EUV lithographic strategies.

Multilayer resist schemes offer unique advantages over single layer resist systems by allowing for the imaging to be accomplished in a thin, top layer, providing for enhanced resolution and improved CD control and depth of focus, as compared to single layer resists. Subsequently a transfer process allows the conveyance of this image through a generally thicker, underlying layer, or layers. The use of two, or more, layers allows the decoupling of imaging resolution and aspect ratio. Using an anisotropic reactive ion etch (RIE) further prevents the toppling of high aspect ratio images that is sometimes encountered with solvent or aqueous base development and rinsing processes. The use of a relatively thick underlayer that is independent of imaging chemistry concerns allows for a degree of independence from swing curve phenomena, and thus allows nearly any thickness of underlayer to be used. Consequently, high aspect ratio images can be printed with extended process latitude. Furthermore, the use of an underlayer allows for planarization over underlying topography.

Current underlayer formulations used in bilayer lithography consist of either a novolak resin dissolved in an appropriate casting solvent or a multicomponent system comprising a base polymer and various additives, each of which serves a particular role in the insolubilization of the resulting films. Both types of underlayer formulations have limitations. Novolak-based systems are simple in that they consist merely of a polymer dissolved in solution. However, the optical properties of these materials have been shown to vary dramatically with variations in processing conditions, resulting in nonrobust antireflective properties. Furthermore, the mechanisms of the crosslinking reactions need for insolubilization are not well understood and difficult to characterize.

The multicomponent systems have been demonstrated to improve the optical robustness in terms of processing conditions and provide excellent etch resistance and planarization properties. However, multicomponent systems sometimes suffer from incompatibility of the constituent materials or immiscibility of additives within the polymeric matrix. This may manifest as shelf-life instability and the formation of particles with prolonged storage. Furthermore, the addition of low molecular weight species to underlayer formulation allows for the potential for diffusion of these species into a subsequently applied imaging layer, thereby leading to intermixing of layers and the degrading the performance of the overall film stack.

SUMMARY OF INVENTION

The present invention addresses these problems experienced in prior art bilayer lithographic systems by providing multifunctional polymers that include chromophore groups as well as crosslinking sites.

The present invention makes possible improved resist structures and especially those multilayer resist structures.

More particularly, the present invention makes it possible to provide resist materials exhibiting desirable optical, physical and chemical properties which can be tuned to the desired imaging wavelength.

The present invention is specifically concerned with a multifunctional polymer comprising a polymeric chain having chromophore groups and crosslinking sites.

Another aspect of the present invention relates to a method for forming a pattern of a resist. The method comprises:

a) providing on a substrate a layer of a resist comprising a multifunctional polymer comprising a polymeric chain having chromophore groups and crosslinking sites;

b) imagewise exposing the resist to actinic radiation in a pattern to thereby cause a change in the solubility of the resist; and c) developing the resist to thereby form the pattern.

A still further aspect of the present invention relates to a method for forming a pattern which comprises:

a) providing on a substrate a layer of a first resist comprising a multifunctional polymer comprising a polymeric chain having chromophore groups and crosslinking sites;

b) at least partially crosslinking the first resist;

c) providing on the first resist a second and different resist composition;

d) imagewise exposing the first and second resist composition to actinic radiation;

e) developing the second resist composition;

f) developing the first resist; and g) etching the substrate using the first resist and second resist as the mask to form the pattern.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
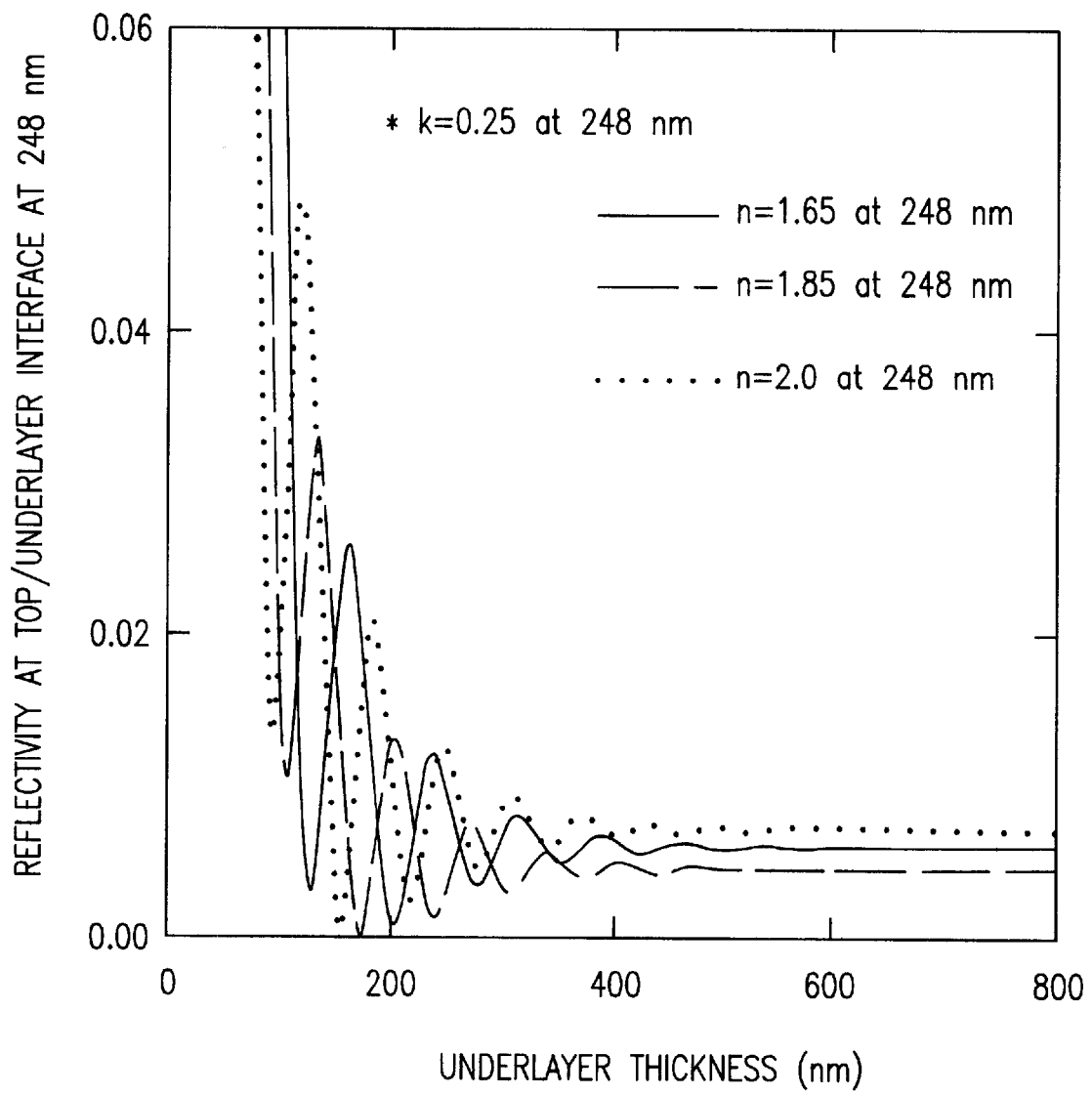
FIG. 1 shows reflectivity at an underlayer/resist interface at 248 nm as a function of underlayer thickness for different values of refractive index (n) using a fixed value of k=0.25.

The present invention is related to polymeric materials that can be specifically tailored in regards to their chemical nature, solubility, optical properties, thermal properties, mechanical properties, etch selectivity, and film forming ability for their use in antireflective coating or as an underlayer formulation for a multilayer photoresist for exposure with ultraviolet radiation of 365, 248, 193, 157, 126, nm; or EUV radiation, or with a beam of electrons or ions; or with x-rays. The polymers of the present invention contain the appropriate functional groups such that, after casting from a suitable solvent, films of these materials may be rendered insoluble by means of thermal and/or photochemical crosslinking without the addition of other components to the formulation. These materials provide the appropriate characteristics such that disadvantageous phenomena such as residue, standing waves, and intermixing are eliminated or at least significantly minimized. More specifically, the polymeric materials of the present invention have a plurality of different chemical moieties along the same polymeric chain, each having a specific function in the overall performance of the material. Optical properties, mode of insolubilization, solubility enhancement, and etch resistance are among the properties that can be tailored by a judicious selection of the chemical constituents. By virtue of partial substitution, multiple functionalities may be added in a tandem sequence of reactions or simultaneously, if the chemical nature and reactivity of the reagents allow. Selection of reaction sequence can in certain instances be important to prevent undesirable cross-reactions.

Examples of suitable polymeric chains or backbones that can be employed according to the present invention are poly(4-hydroxystyrene), copolymers of 4-hydroxystyrene such as with up to 40 weight % of an alkyl methacrylate, alkylacrylate and/or styrene; novolac resins, acrylate polymers, methacrylate polymers, fluorocarbon polymers, and cycloaliphatic polymers such as norbornene-based and maleic anhydride polymers. Some examples of specific polymers include poly(3-hydroxystyrene), poly(acrylic acid), poly(norbonene carboxylic acid), copolymer of (4-hydroxystyrene and styrene), copolymer of 4-hydroxystyrene and acrylic acid, copolymer of styrene and acrylic acid, and copolymer of norbonene and maleic anhydride.

The polymeric backbone provides a suitable platform from which to provide the needed chemical modification. The preferred polymeric backbones contain phenolic hydroxyl groups and the most preferred polymeric backbone is poly(4-hydroxystyrene). The polymeric chain or backbone typically has a number average molecular weight of at least about 2,000 and more typically about 5,000 to about 10,000. The poly(4-hydroxystyrene) is preferred because of the relative ease in modifying it according to the present invention along with possessing excellent film forming and planarization characteristics and good etch resistance.

The polymers of the present invention further include chromophore groups. The chromophore is chosen based on its ability to interact with the exposing radiation or beam and the ability to be covalently attached at a ring-carbon position via an electrophilic or nucleophilic aromatic substitution reaction such as sulfonation, alkylation, acylation, or the like; or through phenolic oxygen via a functional group transformation such as an etherification, esterification, or the like. Suitable chromophores include phenyl, naphthyl, anthryl, flourenyl, benzyl, phenanthryl, and similar conjugated systems as well as derivatives of these and heteroatomic analogs such as thiophenyl, pyridinyl, furanyl, thianthryl, phenothiazinyl, and the like. The chromophores typically have nucleophilic sites.

Examples of suitable chromophores are from 9-anthracenemethanol, 9-anthracenyl sulfonyl chloride, 9-anthracene bromomethane, 1-anthracene methanol, 1-naphthyl methanol, 2-naphthyl methanol, 1-naphthyl sulfonyl chloride and 2-naphthyl sulfonyl chloride. The amount of chromophore is typically about 5 to about 50 mole % and more typically about 10 to about 30 mole % based upon the polymeric chain repeat unit.

In addition, according to the present invention, crosslinking sites are included in the polymer. The crosslinking sites are provided so upon subsequent activation at least partially cross-links the polymer and/or increases its molecular weight to a sufficient degree that dissolution in the casting solvent of a subsequently applied imaging layer, when used, and/or developer of the subsequently applied imaging layer is prevented or limited to such an extent that film thickness changes are inconsequential to the performance of the film stack. The crosslinking sites for insolubilizing the polymer matrix may be introduced again via partial substitution through either a ring carbon or the phenolic oxygen. Such functionality includes any number of suitably reactive functional groups that will undergo a transformation with for example any unreacted crosslinkable sites of the polymer chain such as any unreacted phenolic hydroxyl sites upon treatment with either heat or exposure to radiation, or both, in either sequence. Examples of such reactive groups include epoxides, sulfonic acids, sulfonic acid esters, silyl ethers, vinyl ethers, carboxylic acids, esters of carboxylic acids, anhydrides, alkyl halides, cyanates, isocyanates, and the like. The choice of such a group is based on the balance between its stability in the formulation and its reactivity upon thermal or photochemical treatment. The preferred crosslinking sites are provided by vinyl ethers such as vinyloxyethyl. Other crosslinking sites are provided by epoxy, and bis(methoxymethyl) amino.

The amount of crosslinking sites is typically about 2 to about 50 mole % and more typically about 5 to about 30 mole % based upon the polymeric backbone. The polymers of the present invention include different groups randomly or strategically spaced (i.e. block, alternating, or graft) along the polymeric chain. Moreover, having all the chemical functionalities covalently linked together insures a degree of miscibility not always available with blended additive systems.

Formulations containing polymers of the present invention are superior to other related materials in that, when used as an antireflective coating or as the underlayer in a multilayer resist system, aforementioned disadvantageous phenomena are avoided by prevention of intermixing and or interaction at the interface. Whereas other systems have been described that have similar properties, all those require addition of ancillary materials to cause the desired insolubilization. Such additives are not needed for the presently described materials to function with similar or superior performance, thereby simplifying the formulation. Additionally, these materials are versatile and compatible such that additional materials can be included for desired variation in their performance.

The polymers of the present invention, as mentioned above, are capable of insolubilization by internal crosslinking under thermal and/or photochemical treatment without the addition of other components to the formulation. To enhance performance or tune solubility, additional functional groups can be covalently attached by analogous methods. Additionally photosensitive or thermally sensitive functionalities maybe incorporated into the polymeric backbone by analogous methods.

Thin films of this material can be prepared as described in Example 2, thus, providing a suitable planarizing underlayer and/or antireflection layer to be used in conjunction with any number of subsequently applied imaging photoresists as described in Example 4 below and in the following patents:

U.S. Pat. Nos. 5,580,694; 5,554,485; 5,545,509; 5,492,793; 5,401,614; 5,296,332; 5,240,812; 5,071,730; 4,491,628; 5,585,220; 5,561,194; 5,547,812; 5,498,765; 5,486,267; 5,482,817; 5,464,726; 5,380,621; 5,374,500; 5,372,912; 5,342,727; 5,304,457; 5,300,402; 5,278,010; 5,272,042; 5,266,444; 5,198,153; 5,164,278; 5,102,772; 5,098,816; 5,059,512; 5,055,439; 5,047,568; 5,045,431; 5,026,624; 5,019,481; 4,940,651; 4,939,070; 4,931,379; 4,822,245; 4,800,152; 4,760,013; 4,551,418; 5,338,818; 5,322,765; 5,250,395; 4,613,398; 4,552,833; 5,457,005; 5,422,223; 5,338,818; 5,322,765; 5,312,717; 5,229,256; 5,286,599; 5,270,151; 5,250,395; 5,238,773; 5,229,256; 5,229,251; 5,215,861; 5,204,226; 5,115,095; 5,110,711; 5,059,512; 5,041,358; 5,023,164; 4,999,280; 4,981,909; 4,908,298; 4,867,838; 4,816,112; 4,810,601; 4,808,511; 4,782,008; 4,770,974; 4,693,960; 4,692,205; 4,665,006; 4,657,845; 4,613,398; 4,603,195; 4,601,913; 4,599,243; 4,552,833; 4,507,331; 4,493,855; 4,464,460; 4,430,153; 4,307,179; 4,307,178; 5,362,599; 4,397,937; 5,567,569; 5,342,727; 5,294,680; 5,273,856; 4,980,264; 4,942,108; 4,880,722; 4,853,315; 4,601,969; 4,568,631; 4,564,575; 4,552,831; 4,522,911; 4,464,458; 4,409,319; 4,377,633; 4,339,522; 4,259,430; 5,209,815; 4,211,834; 5,260,172; 5,258,264; 5,227,280; 5,024,896; 4,904,564; 4,828,964; 4,745,045; 4,692,205; 4,606,998; 4,600,683; 4,499,243; 4,567,132; 4,564,584; 4,562,091; 4,539,222; 4,493,855; 4,456,675; 4,359,522; 4,289,573; 4,284,706; 4,238,559; 4,224,361; 4,212,935; 4,204,009; 5,091,103; 5,124,927; 5,378,511; 5,366,757; 4,590,094; 4,886,727; 5,268,260; 5,391,464; 5,115,090; 5,114,826; 4,886,734; 4,568,601; 4,678,850; 4,543,319; 4,524,126; 4,497,891; 4,414,314; 4,414,059; 4,398,001; 4,389,482; 4,379,826; 4,379,833; and 4,187,331;

which are described herein by reference.

Figure 2:
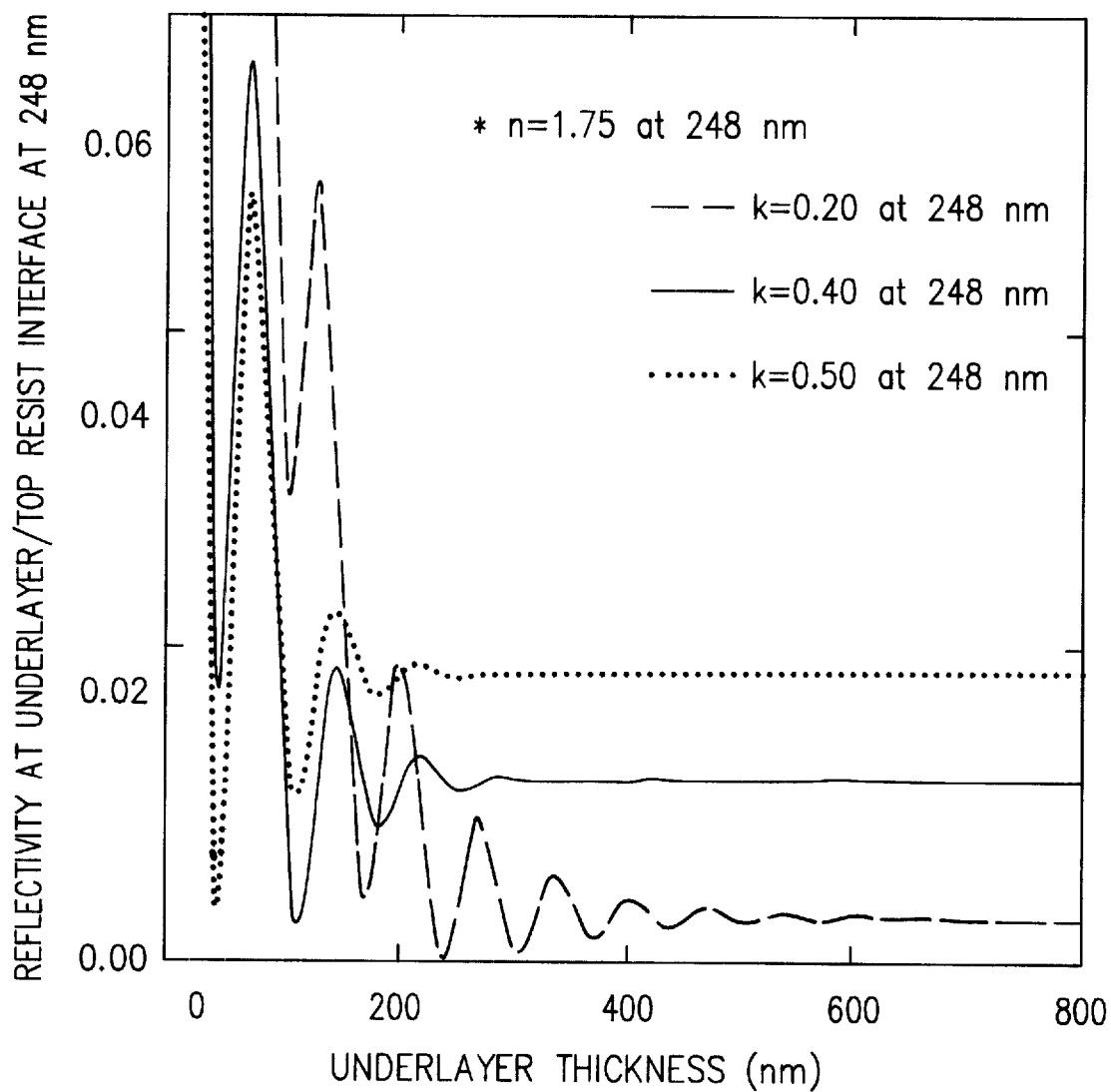
FIG. 2 shows reflectivity at an underlayer/resist interface at 248 nm as a function of underlayer thickness, where k of the underlayer varies, wherein n is fixed at 1.75.

By way of specific example, poly(4-hydroxystyrene) that has ~17% on the aromatic rings C-alkylated with methyl-9-anthracene groups as a 248-nm radiation absorbing chromophore is reacted with ~0.25 equivalents of 2-chloroethyl vinyl ether in the presence of a base/acid scavenger to yield ethenyloxyethyl substituted phenolic polymer as shown in Example 1. The resulting pendant vinyl ether functionality can undergo reaction with unsubstituted phenolic hydroxyl group by heating as described by S. Moon, K. Naitoh, and T. Yamaoka in *Chem. Mater.* 1993, 5, 1315–1320. Thus, heating a cast film of this material and subsequent baking can form interchain bonds, i.e. crosslinking resulting in a polymeric network, as shown in FIG. 2. The resulting material is impervious to the casting solvent of the subsequently applied imaging layer and therefore prevents intermixing or substantial interactions at the interface. As the optical properties of this material were tuned by controlled level of anthracenyl incorporation, this underlayer provides the requisite antireflective properties necessary to reduce or eliminate thin film interference effects. The multilayer resist structures described herein can be used for 248, 193, 157, 126, or 13 nm, e-beam, x-ray, and ion beam lithography.

When used as a lithographic material, the compositions of the present invention are applied to a desired substrate to provide films generally about 50 nanometers to about 1000 nanometers thick, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip.

In addition, the materials of the present invention can be used in conjunction with those substrates employed as chip carriers and including ceramic substrates and especially multilayer ceramic devices. Also included are dielectric substrates which can be thermoplastic and/or thermosetting polymers. Typical thermosetting polymeric materials include epoxy, phenolic-based materials, polyamides and polyimides. The dielectric materials may be molded articles of the polymers containing fillers and/or reinforcing agents such as glass-filled epoxy or phenolic-based materials. Examples of some phenolic-type materials include copolymers of phenol, resorcinol and cresol. Examples of some suitable thermoplastic polymeric materials include polyolefins, such as polypropylene, polysulfones, polycarbonates, nitrile rubbers and ABS polymers.

When used in a multilayer resist technique, the polymers of the present invention are used as the bottom layer and typically employed at a thickness of about 50 nanometers to about 3000 nanometers, and more typically about 500 nanometers to about 2000 nanometers.

The top resist layer in such a structure is typically about 100 nanometers to about 500 nanometers, and more typically about 200 nanometers to about 300 nanometers thick.

The following non-limiting examples are presented to further illustrate the present invention. Because these examples are given for illustrative purposes only, the invention embodied therein should not be limited thereto.

EXAMPLE 1

Synthesis of Poly(4-hydroxystyrene) PHS-Bsed Terpolymer

This example demonstrates the synthesis of a PHS-based terpolymer containing 25 mol-% vinylether substitution and 17 mol-% 9-anthracenemethanol substitution. Poly(4-hydroxystyrene) (about 20 g) is dissolved in about 200 mL of anhydrous acetonitrile. To this solution is added p-toulenesulfonic acid (about 0.55 g) and 9-anthracenemethanol (about 6.1 g). The solution is stirred under a blanket of nitrogen and heated at reflux for about 16 hr. The solution is allowed to cool to room temperature, neutralized with aqueous ammonium hydroxide, and added with vigorous stirring to about 2 L of water. The resulting precipitate is collected, washed with water, and dried under vacuum. This material (about 7.5 g) is dissolved in about 75 mL of dimethyl sulfoxide (DMSO) with potassium hydroxide (about 1.4 g). The solution is heated to about 70° C. under a blanket of nitrogen for about 30 min. A solution of 2-chloroethyl vinyl ether (about 2.6 g) and benzyl tributylammonium bromide (about 0.87 g) in about 5 mL DMSO (dimethylsulfoxide) is added dropwise and the solution allowed to stir for about 4 hr. After cooling to room temperature, acetic acid is added to neutralize the solution. The desired polymeric product is obtained by precipitation of this solution into about 1 L water, followed by filtration, washing with water, and vacuum drying. The structure of the PHS based terpolymer described above can be represented as follows:

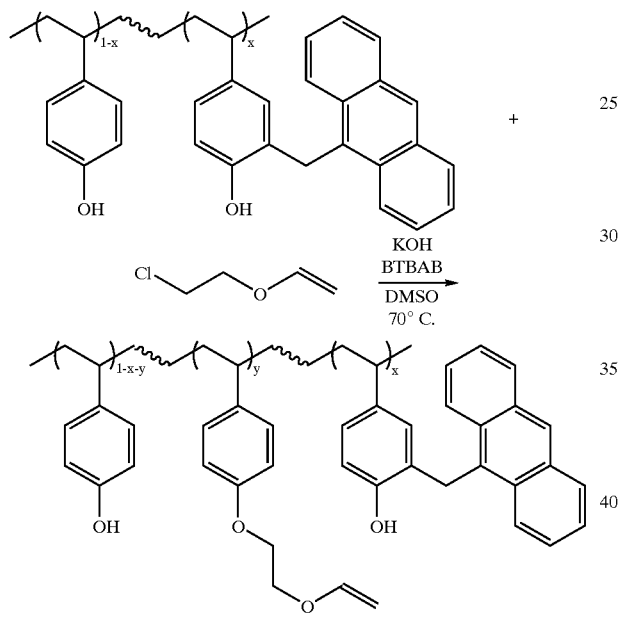

EXAMPLE 2

This example demonstrates a one-component underlayer formulation and thin film prepared therefrom. The polymeric material described in Example 1 is dissolved in propylene glycol monomethyl ether acetate to provide a 20 wt-% solution, that is subsequently filtered to remove particulate matter. This solution is then cast onto a suitable substrate such as a silicon wafer using conventional spin casting techniques. A post-application bake is used to remove casting solvent. This baking step may also be used to initiate crosslinking reactions within the polymeric matrix. Alternatively, a second baking procedure maybe employed to thermally trigger the crosslinking reaction. Alternatively, exposure to actinic radiation or a beam of ions or electrons maybe used to trigger the crosslinking reaction. Also, a sequence of baking and exposure steps may be employed similarly. After this treatment, the film is suitably cross-linked into a polymeric network or to a degree that the increase in molecular weight of the resulting polymer is sufficiently high that dissolution in the casting solvent of a subsequently applied imaging layer and/or the developer of the subsequently applied imaging material is prevented or limited to such an extent that film thickness changes are inconsequential to the performance of the film stack.

The structure of the crosslinked polymer can be represented as follows:

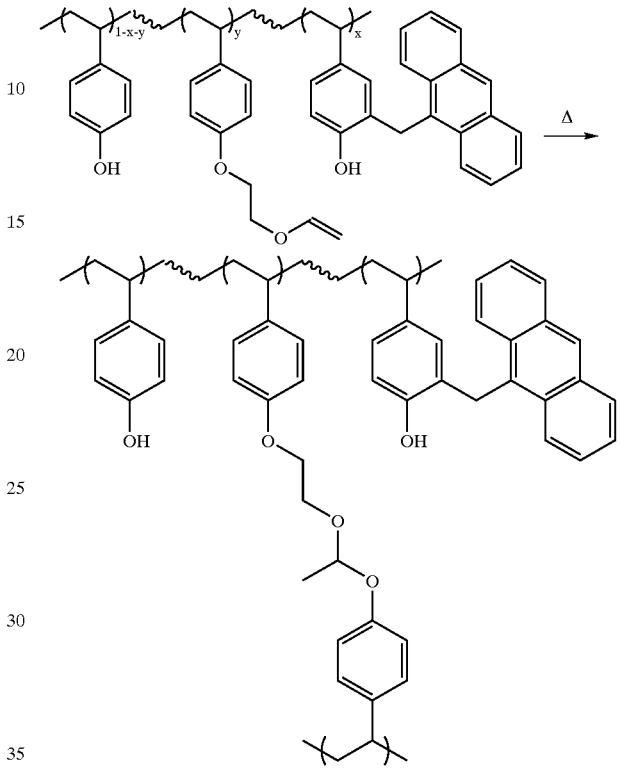

EXAMPLE 3

The following example illustrates calculations for obtaining optimum bottom layer parameters of a bilayer system. Parameters are optimized so as to reduce reflections at the resist/underlayer interface. Computations are based on algorithms which use the Fresnel coefficients as found in standard textbooks such as *Optics,* by E. Hecht and A. Zajac, published in 1979 by Wiley, pages 312 and 313. These simulations can be extended to many different structures and they are not limited by the examples given below. The structure simulated in this example includes a Si substrate, underlayer, and photoresist. The parameters under investigation are the bottom layer optical constants n and k and film thickness d. The imaging Si-containing resist index of refraction extinction coefficient k and film thickness are fixed and given by n=1.78, k=0.018 and d=2000 Å at 248 nm. FIG. 1 shows reflectivity at the underlayer/resist interface at 248 nm as a function of underlayer thickness for different values of refractive index (n) using a fixed value of k=0.25. The structure simulated includes a Si substrate, underlayer, and photoresist. These simulations show that there is no significant variation in reflectance as a function of refractive index. For instance, if 5000 Å of an underlayer with 1.65<n<2.0 at 248 nm is chosen, a significant reflectivity reduction (less than 0.01) can be achieved at the resist/underlayer interface. FIG. 2 shows reflectivity at the underlayer/resist interface at 248 nm as a function of underlayer thickness, where k of the underlayer varies, but n is fixed at 1.75. The simulated layered structure is similar to the one described above. In this case, by increasing the extinction coefficient higher values of reflectance are obtained for a 5000 A thick underlayer. For bilayer resist structures, the extinction coefficient has a stronger impact on reflectance than does the index of refraction.

An underlayer material with k value of ~0.2 or slightly below is desirable. The optimum optical properties of the underlayer are an index of refraction in a range from 1.65 to 2.0 and an extinction coefficient from about 0.18 to about 0.22 at 248 nm. Thus, by using an underlayer 5000 Å or thicker, the reflectance becomes insensitive to the underlying topography.

EXAMPLE 4

The following example is given to demonstrate the tuning of optical properties of the underlayer materials. A PHS based terpolymer containing vinylether and 9-anthracenemethanol is prepared as described in Example 1. The molar ratios of vinylether and 9-anthracenemethanol were varied as shown in Table 1 below. Formulations are prepared as described in Example 2. Formulations are spun coated onto 8" wafers then baked at 170 degrees C. for 90 seconds using a contact hotplate. The optical constants (the index of refraction (n) and the extinction coefficient (k) at 193 and 248 nm ) are measured using an n&k Analyzer manufactured by n&k Technology, S. Clara, Calif. A description of this instrument and its operation can be found in U.S. Pat. No. 4,905,170, disclosure of which is incorporated herein by reference, and are summarized in Table 2. As apparent from the results, the optical properties of these terpolymers are easily tunable by adjusting the mol-% of 9-anthracenemethanol.

| Material | % AnMeOH | $n_{248\ nm}$ | $k_{248\ nm}$ | $n_{193\ nm}$ | $k_{193\ nm}$ |
|---|---|---|---|---|---|
| DRM 35 | 10 | 1.830 | 0.19 | 1.75 | 0.80 |
| DRM 36 | 15 | 1.790 | 0.22 | 1.83 | 0.83 |
| DRM 37 | 20 | 1.700 | 0.26 | 1.66 | 0.86 |

What is claimed is:

1. A multifunctional polymer comprising a polymeric chain having chromophore groups and crosslinking sites; wherein the polymer is crosslinkable without the need of other components and wherein said chromophore groups are capable of interacting with the exposing radiation or beam to which the polymer is to be exposed and are derived from 9-anthracenemethanol, and reduces reflectivity upon exposure to said exposing radiation or beam;
    wherein the chromophore groups are attached to polymeric chain at a ring-carbon position via an electrophilic or nucleophilic aromatic substitution reaction or through phenolic oxygen via a functional group transformation; and wherein the amount of said crosslinking sites is about 2 to about 50 mole % based upon the polymeric chain;
    wherein the functional group transformation is selected from the group consisting of etherification and esterification; and
    wherein the polymeric chain is selected from the group consisting of poly(4-hydroxystyrene), copolymers of 4-hydroxystyrene, novolac resins, acrylate polymers, methacrylate polymers, fluorocarbon polymers and cycloaliphatic polymers.

2. The multifunctional polymer of claim 1 wherein the polymeric chain comprises poly(4-hydroxystyrene).

3. The multifunctional polymer of claim 1 wherein the polymeric chain has a number average molecular weight of at least about 2000.

4. The multifunctional polymer of claim 1 wherein the polymeric chain has a number average molecular weight of about 5000 to about 10,000.

5. The multifunctional polymer of claim 1 wherein the aromatic substitution is selected from the group consisting of sulfonation, alkylation and acylation.

6. The multifunctional polymer of claim 1 wherein the amount of chromophore is about 5 to about 50% by weight based upon the weight of the polymeric chain.

7. The multifunctional polymer of claim 1 wherein the crosslinking sites are selected from the group consisting of epoxy, sulfonic acid, sulfonic acid esters, silyl ethers, vinyl ethers, carboxylic acid, carboxylic acid ester, carboxylic acid anhydride, alkyl halide, cyanate and isocyanate.

8. The multifunctional polymer of claim 1 wherein the crosslinking sites are vinyl ethers.

9. The multifunctional polymer of claim 1 wherein the amount of said crosslinking sites is about 5 to about 25 mole % based upon the polymeric chain.

10. A structure comprising a substrate and a layer of a multifunctional polymer according to claim 1 coated on the substrate.

11. The structure of claim 10 wherein the layer has a thickness of about 50 nanometers to about 1000 nanometers.

12. A structure comprising a substrate,
    a first layer of a multifunctional polymer according to claim 1 coated on the substrate;
    a second layer of a resist different from the layer of the multifunctional polymer located on the first layer of the multifunctional polymer.

13. The structure of claim 12 wherein the first layer is about 500 nanometers to about 3000 nanometers thick and the second layer is about 100 nanometers to about 500 nanometers thick.

14. The structure of claim 13 wherein the fat layer is crosslinked.

15. A composition comprising the multifunctional polymer of claim 1 and propylene glycol monomethyl ether acetate.

16. A method for forming a pattern which comprises:
    a) providing on a substrate an under layer comprising a multifunctional polymer comprising a polymeric chain having chromophore groups and crosslinking sites;
        wherein the polymer is crosslinkble without the need of other components and wherein said chromophore groups are capable of reducing reflectivity at the interface with a subsequently applied resist;
        wherein the chromophore groups are attached to the polymeric chain at a ring-carbon position via an electrophilic or nucleophilic aromatic substitution reaction or through phenolic oxygen in a functional group transformation; and wherein the functional group transformation is selected from the group consisting of etherification and esterification;
    b) at least partially crosslinking the underlayer to form a film;
    c) providing on the underlayer a second and different material comprising a resist composition;
    d) imagewise exposing the resist composition to actinic radiation;
    e) developing the resist composition to form a pattern;
    f) transferring said pattern into the underlayer by the etching using the resist composition that is remaining as a mask; and g) transferring said pattern into the substrate by etching using the underlayer that is remaining as a mask to form the pattern.

17. The method of claim 16 wherein the thickness of the underlayer is about 50 nanometers to about 3000 nanometers.

18. The method of claim 16 wherein the thickness of the underlayer is about 500 nanometers to about 2000 nanometers.

19. The method of claim 16 wherein the polymeric chain is selected from the group consisting of poly(4-hydroxystyrene), copolymers of 4-hydroxystyrene, novolac resins, acrylate polymers, methacrylate polymers, fluorocarbon polymers and cycloaliphatic polymers.

20. The method of claim 16 wherein the polymeric chain comprises poly(4hydroxystyrene).

21. The method of claim 16 wherein the polymeric chain has a number average molecular weight of at least about 2000.

22. The method of claim 16 wherein the polymeric chain has a number average molecular weight of about 5000 to about 10,000.

23. The method of claim 16 wherein the aromatic substitution is selected from the group consisting of sulfonation, alkylation and acylation.

24. The method of claim 16 wherein the chromophore comprises a ring moiety selected from the group consisting of phenyl, naphthyl, anthryl, fluorenyl, benzyl, phenanthryl, thiophenyl, pyridinyl, furanyl, thianthryl and phenothiazinyl.

25. The method of claim 16 wherein the chromophore groups are derived from 9-anthracenemethanol.

26. The method of claim 16 wherein the amount of chromophore is about 5 to about 50% by weight based upon the polymeric chain.

27. The method of claim 16 wherein the crosslinking sites are selected from the group consisting of epoxy, sulfonic acid, sulfonic acid esters, silyl ethers, vinyl ethers, carboxylic acid, carboxylic acid ester, carboxylic acid, anhydride, alkyl halide, cyanate and isocyanate.

28. The method of claim 16 wherein the crosslinking sites are vinyl ethers.

29. The method of claim 16 wherein the amount of crosslinking site is about 2 to about 50 mole % based upon the polymeric chain.

30. The method of claim 16 wherein the amount of crosslinking site is about 5 to about 25 mole % based upon the polymeric chain.

31. A method for forming a pattern which comprises:

a) providing on a substrate an underlayer comprising a multifunctional polymer comprising a polymeric chain having chromophore groups and crosslinking sites;

wherein the polymer is crosslinkable without the need of other components and wherein said chromophore groups are capable of reducing reflectivity at the interface with a subsequently applied resist; and wherein the chromophore groups are derived from 9-anthracenemethanol;

wherein the chromophore groups are attached to the polymeric chain through phenolic oxygen in a functional group transformation;

b) at least partially crosslinking the underlayer to form a film;

c) providing on the underlayer a second and different material comprising a resist composition;

d) imagewise exposing the resist composition to actinic radiation;

e) developing the resist composition to form a pattern;

f) transferring said pattern into the underlayer by the etching using the resist composition that is remaining as a mask; and g) transferring said pattern into the substrate by etching using the underlayer that is remaining as a mask to form the pattern.

* * * * *